(12) United States Patent
Miyanami

(10) Patent No.: US 9,293,722 B2
(45) Date of Patent: Mar. 22, 2016

(54) SOLID-STATE IMAGE PICKUP DEVICE, METHOD OF MANUFACTURING THE SAME, AND ELECTRONIC APPARATUS

(71) Applicant: SONY CORPORATION, Tokyo (JP)

(72) Inventor: Yuki Miyanami, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/395,401

(22) PCT Filed: Apr. 17, 2013

(86) PCT No.: PCT/JP2013/061363
§ 371 (c)(1),
(2) Date: Oct. 17, 2014

(87) PCT Pub. No.: WO2013/164948
PCT Pub. Date: Nov. 7, 2013

(65) Prior Publication Data
US 2015/0115243 A1   Apr. 30, 2015

(30) Foreign Application Priority Data

May 1, 2012   (JP) .................................. 2012-104521

(51) Int. Cl.
*H01L 51/44*   (2006.01)
*H01L 27/30*   (2006.01)

(52) U.S. Cl.
CPC ............ *H01L 51/448* (2013.01); *H01L 27/307* (2013.01)

(58) Field of Classification Search
CPC ............................ H01L 51/448; H01L 27/307
See application file for complete search history.

(56) References Cited

FOREIGN PATENT DOCUMENTS

| | | |
|---|---|---|
| JP | H07-130732 | 5/1995 |
| JP | 2001-345319 | 12/2001 |
| JP | 2003-332551 | 11/2003 |
| JP | 2007-12796 A | 1/2007 |
| JP | 2007-250890 A | 9/2007 |
| JP | 2010-67827 | 3/2010 |
| JP | 2011-029337 | 2/2011 |
| JP | 2011-138927 A | 7/2011 |
| JP | 2011-187663 A | 9/2011 |
| JP | 2011-228623 A | 11/2011 |

OTHER PUBLICATIONS

International Search Report prepared by the Japanese Patent Office on May 31, 2013, for International Application No. PCT/JP2013/061363.

*Primary Examiner* — Roy Potter
*Assistant Examiner* — Paul Patton
(74) *Attorney, Agent, or Firm* — Sheridan Ross P.C.

(57) ABSTRACT

A solid-state image pickup device includes: an organic photoelectric conversion layer; a passivation layer formed to cover a top of the organic photoelectric conversion layer; and an insulating film formed on the passivation layer and in a slit produced on a level difference in the passivation layer, the insulating film having a smaller refractive index than that of the passivation layer.

7 Claims, 10 Drawing Sheets

SOLID-STATE IMAGE PICKUP DEVICE, METHOD OF MANUFACTURING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2013/061363 having an international filing date of Apr. 17, 2013, which designated the United States, which PCT application claimed the benefit of Japanese Patent Application No. 2012-104521 filed May 1, 2012, the disclosure of each of which are incorporated herein by reference.

TECHNICAL FIELD

The present technology relates to a solid-state image pickup device, a method of manufacturing the same, and an electronic apparatus including the solid-state image pickup device.

BACKGROUND ART

In recent years, in CCD image sensors and CMOS image sensors, sensitivity is reduced by a reduction in the number of photons incident on a unit pixel with a reduction in pixel size, thereby leading to a reduction in S/N. Moreover, in a currently widely used pixel arrangement where red, green, and blue pixels are arranged on a plane, green and blue light does not pass through a color filter in the red pixel and is not used in photoelectric conversion, thereby resulting in a loss of sensitivity. Further, an issue of a false color arises in association with generation of a color signal by interpolation processing between pixels.

As a method of solving these issues, there is known an image sensor configured by laminating three photoelectric conversion layers in a vertical direction to obtain photoelectric conversion signals of three colors by one pixel. As such a configuration in which photoelectric conversion layers of three colors are laminated in one pixel, for example, there is proposed a configuration in which a photoelectric conversion section configured to detect green light is provided above a silicon substrate and two PDs laminated in the silicon substrate are configured to detect blue light and red light (refer to PTL 1).

Moreover, there is proposed a backside illumination type configuration having a circuit formation surface formed on a side opposite to a light reception surface in a configuration in which one photoelectric conversion film is provided above a silicon substrate and photoelectric conversion sections of two colors are provided in the silicon substrate.

In addition, there is proposed specifically a backside illumination type configuration in which an organic photoelectric conversion section configured of an organic photoelectric conversion layer is formed above a silicon substrate (refer to PTL 2). In this configuration, a circuit, wiring, and the like are not formed between an inorganic photoelectric conversion section and the organic photoelectric conversion section; therefore, a distance between the inorganic photoelectric conversion section and the organic photoelectric conversion section in a same pixel is allowed to be reduced. Therefore, F-number dependence of each color is allowed to be suppressed, and variation in sensitivity among respective colors is allowed to be reduced.

In a case where the organic photoelectric conversion section is provided above the substrate, a level difference is formed by the organic photoelectric conversion section. Therefore, to form an on-chip lens on the organic photoelectric conversion section, it is necessary to eliminate the level difference for planarization.

The above-described PTL 2 describes a flow in which, after a laminate film of an organic photoelectric conversion layer and an upper electrode configuring the organic photoelectric conversion section is patterned, and processed by dry etching, a planarization film is embedded, and an on-chip lens is formed above the planarization film.

Moreover, as a planarization method of reducing a level difference, there is proposed a method in which formation of NSG by a coating film and etchback on an entire surface are performed (for example, refer to PTL 3). Further, there is proposed a technique in which a first passivation film is etched back to reduce a level difference and then a second passivation film is laminated (for example, refer to PTL 4).

CITATION LIST

Patent Literature

PTL 1: Japanese Unexamined Patent Application Publication No. 2003-332551
PTL 2: Japanese Unexamined Patent Application Publication No. 2011-29337
PTL 3: Japanese Unexamined Patent Application Publication No. H7-130732
PTL 4: Japanese Unexamined Patent Application Publication No. 2001-345319

SUMMARY OF INVENTION

An organic photoelectric conversion layer is susceptible to time degradation caused by water or the like. Therefore, it is desired to protect the organic photoelectric conversion layer, i.e., to sufficiently secure a passivation property with respect to the organic photoelectric conversion layer.

Moreover, to form an on-chip lens, it is desirable to form a thick planarization layer to eliminate a large level difference caused by the organic photoelectric conversion section for planarization. Therefore, light is attenuated by the thick planarization layer and a passivation layer, thereby leading to a reduction in a light-condensing effect. In the methods of reducing the level difference disclosed in PTL 3 and PTL 4, the number of processes is greatly increased. Moreover, since the level difference remains, in a case where a level difference reduction effect is small, the method is repeated a plurality of times.

Therefore, it is desirable to provide a solid-state image pickup device capable of achieving both an improvement in a passivation property with respect to a photoelectric conversion layer of an organic photoelectric conversion section and favorable light-condensing characteristics, a method of manufacturing the same, and an electronic apparatus including such a solid-state image pickup device.

A solid-state image pickup device according to an embodiment of the present technology includes: an organic photoelectric conversion layer; and a passivation layer formed to cover a top of the organic photoelectric conversion layer. The solid-state image pickup device further includes an insulating film formed on the passivation layer and in a slit produced on a level difference in the passivation layer, the insulating film having a smaller refractive index than that of the passivation layer.

A method of manufacturing a solid-state image pickup device according to an embodiment of the present technology is to manufacture a solid-state image pickup device including an organic photoelectric conversion layer. Then, the method includes steps of: forming the organic photoelectric conversion layer; and forming a passivation layer to cover a top of the organic photoelectric conversion layer. The method further includes a step of forming an insulating film on the passivation layer and in a slit produced on a level difference in the passivation layer, the insulating film having a smaller refractive index than that of the passivation layer.

An electronic apparatus according to an embodiment of the present technology includes: an optical system; the solid-state image pickup device according to the above-described embodiment of the present technology; and a signal processing circuit configured to process an output signal of the solid-state image pickup device.

In the solid-state image pickup device according to the embodiment of the present technology, the insulating film with a smaller refractive index than that of the passivation layer is formed on the passivation layer that covers the top of the organic photoelectric conversion layer and in the slit produced on the level difference in the passivation layer. Therefore, entry of water or the like from outside to the organic photoelectric conversion layer through the slit produced on the level difference in the passivation layer is allowed to be suppressed. Moreover, the slit formed on the level difference in the passivation layer is obliquely formed, and the insulating film in the slit has a smaller refractive index than that of the passivation layer. Therefore, incident light is allowed to be reflected by an interface between the insulating film in the slit and the passivation layer to be condensed to the passivation layer.

In the method of manufacturing the solid-state image pickup device according to the embodiment of the present technology, the slit is allowed to be filled with the insulating film by forming the insulating film with a smaller refractive index than that of the passivation layer on the passivation layer and in the slit produced on the level difference in the passivation layer. Therefore, entry of water or the like from outside through the slit produced on the level difference in the passivation layer during manufacturing or in a manufactured product is allowed to be suppressed. Moreover, the slit on the level difference in the passivation layer is obliquely formed, and the insulating film with a smaller refractive index than that of the passivation layer is formed in the slit. Therefore, a configuration in which incident light is allowed to be reflected by an interface between the insulating film in the slit and the passivation layer to be condensed to the passivation layer is allowed to be manufactured.

In the electronic apparatus according to the embodiment of the present technology, the solid-state image pickup device according to the embodiment of the present technology is included; therefore, in the solid-state image pickup device, entry of water or the like from outside to the organic photoelectric conversion layer is allowed to be suppressed, and incident light is allowed to be condensed to the passivation layer.

According to the solid-state image pickup device, the method of manufacturing the solid-state image pickup device, and the electronic apparatus of the embodiments of the present technology, entry of water or the like from outside to the organic photoelectric conversion layer is allowed to be suppressed by the insulating film formed in the slit produced in the passivation layer; therefore, a passivation property with respect to the organic photoelectric conversion layer is allowed to be improved. Therefore, reliability of the solid-state image pickup device and the electronic apparatus including the solid-state image pickup device is allowed to be improved.

Moreover, incident light is allowed to be condensed to the passivation layer by the insulating film; therefore, light-condensing characteristics are allowed to be improved to achieve favorable light-condensing characteristics. Therefore, both an improvement in the passivation property with respect to the organic photoelectric conversion layer and favorable light-condensing characteristics are allowed to be achieved by the present technology.

BRIEF DESCRIPTION OF DIAGRAMS

DESCRIPTION OF EMBODIMENTS

Some best modes for carrying out the present technology (hereinafter referred to as "embodiments") will be described below. It is to be noted that description will be given in the following order.
1. First Embodiment (Solid-state Image Pickup Device)
2. Modification Example of First Embodiment
3. Second Embodiment (Electronic Apparatus)

1. First Embodiment

Solid-State Image Pickup Device

Figure 1:
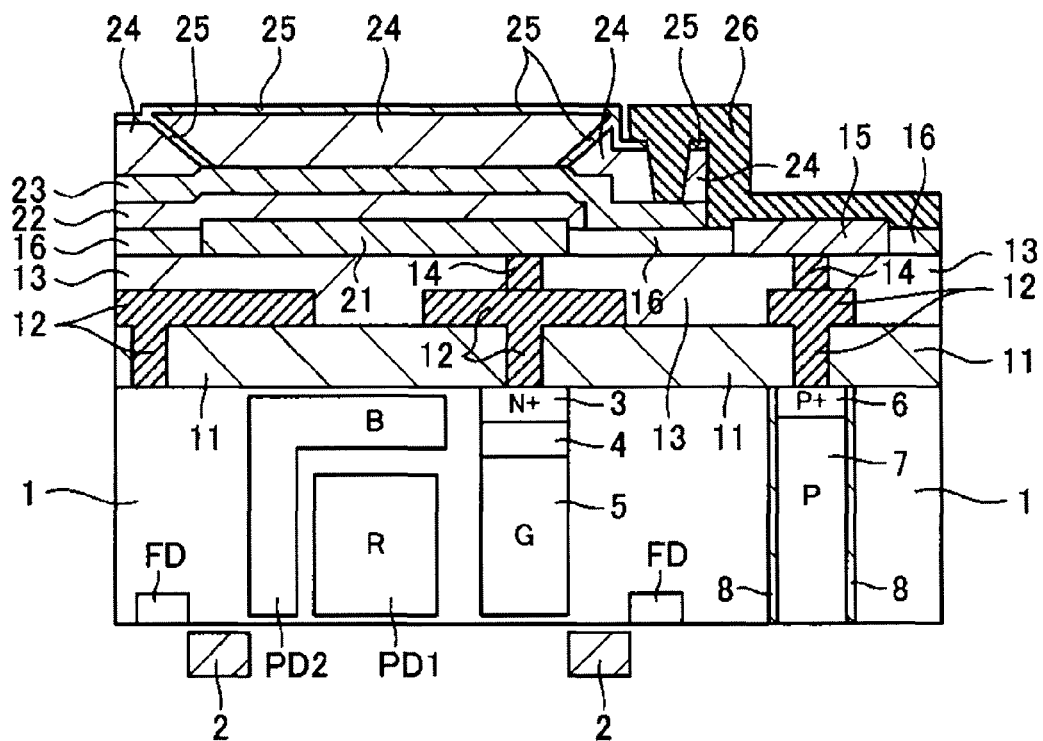
FIG. 1 is a schematic configuration diagram (a sectional view of a main part) of a solid-state image pickup device according to a first embodiment.

FIG. 1 illustrates a schematic configuration diagram (a sectional view of a main part) of a solid-state image pickup device according to a first embodiment. In this embodiment, the present technology is applied to a CMOS type solid-state image pickup device (CMOS image sensor).

FIG. 1 illustrates a sectional view of one pixel of the solid-state image pickup device. As illustrated in FIG. 1, in the solid-state image pickup device according to this embodiment, two photoelectric conversion sections PD1 and PD2 that are laminated in a depth direction are formed inside a semiconductor base 1. Each of the photoelectric conversion sections PD1 and PD2 may be, for example, a photodiode formed inside the semiconductor base 1. A top surface and a bottom surface of the semiconductor base 1 in the diagram serve as a light incident surface and a circuit formation surface, respectively. Although not illustrated, on a circuit formation surface side of the semiconductor base 1, a pixel transistor such as an amplification transistor is formed for each pixel and a peripheral circuit such as a logic circuit is formed in a region serving as a peripheral circuit section.

The semiconductor base 1 is made of a semiconductor material such as silicon. As the semiconductor base 1, a semiconductor substrate, a semiconductor substrate and a semiconductor epitaxial layer located thereon, a semiconductor layer located on an insulating layer, or the like may be used. Moreover, a silicon layer of an SOI substrate configured by forming the silicon layer on a silicon substrate with a silicon oxide film in between may be used for the semiconductor base 1.

A first photoelectric conversion section PD1 on a lower side of the two photoelectric conversion sections PD1 and PD2 performs photoelectric conversion on light of red R of a long wavelength. A second photoelectric conversion section PD2 on an upper side performs photoelectric conversion on light of blue B of a short wavelength. The photoelectric conversion sections PD1 and PD2 configure a vertical spectroscopic image sensor. The second photoelectric conversion section PD2 includes a portion laminated on the first photoelectric conversion section PD1 and a portion (a plug section) so formed as to extend downward in the diagram to be connected to the circuit on the circuit formation surface. For the second photoelectric conversion section PD2, a floating diffusion FD is provided on a left side in the semiconductor base 1 with a transfer gate 2 in between. For o the first photoelectric conversion section PD1, a transfer gate and a floating diffusion are provided to respective portions that are not illustrated.

In the semiconductor base 1, a charge accumulation section 5 for accumulation of a charge obtained by photoelectric conversion of light of green G by an organic photoelectric conversion section that will be described in detail later is formed on a right side of the photoelectric conversion sections PD1 and PD2. Moreover, an overflow bather 4 and an N+ contact section 3 are formed on the charge accumulation section 5. The charge accumulation section 5 is formed in an N-type semiconductor region, and the overflow barrier 4 is formed in a P-type semiconductor region of low concentration. A floating diffusion FD is provided on a right side of the charge accumulation section 5 with a transfer gate 2 in between.

A P+ contact section 6 and a P-type plug region 7 for connection between the organic photoelectric conversion section and the circuit on the circuit formation surface are formed further on the right side in the semiconductor base 1. Moreover, an insulating film 8 for insulation between the semiconductor base 1, and the contact section 6 and the plug region 7 is formed on peripheries of the contact section 6 and the plug region 7. For example, a silicon oxide film, a silicon nitride film, or the like may be used for the insulating film 8.

Although not illustrated, a wiring section (a multilayer wiring section) configured of a plurality of wiring layers that are so formed as to be vertically laminated with an interlayer insulating layer in between is formed on a bottom side of the circuit formation surface of the semiconductor base 1. Moreover, although not illustrated, a supporting substrate is formed below the wiring section (the multilayer wiring section).

An insulating layer 11 is formed on the light incident surface (a top surface) of the semiconductor base 1. The insulating layer 11 may be desirably made of a material having a small interface state to reduce an interface state with the semiconductor base 1 and suppress generation of a dark current from an interface between the semiconductor base 1 and the insulating layer 11. As such an insulating layer 11, for example, a laminate configuration film of a hafnium oxide ($HfO_2$) film formed by an ALD (atomic layer deposition) method and a $SiO_2$ film formed by a plasma CVD method may be used. However, the configuration and film formation method thereof are not necessarily limited thereto.

Moreover, a conductive layer 12 is formed inside contact holes formed in the insulating layer 11 as well as on the insulating layer 11. The conductive layer 12 is configured of conductive plugs inside the contact holes and a wiring layer on the insulating layer 11. The N+ contact section 3 and the P+ contact section 6 that are formed around the top surface inside the semiconductor base 1 are individually connected to respective portions corresponding to the conductive plugs of the conductive layer 12. Moreover, since a portion corresponding to the wiring layer of the conductive layer 12 is so formed as to extend toward a horizontal direction from the portion corresponding to the conductive plug, a portion below the conductive layer 12 of the semiconductor base 1 is allowed to be shielded from light. In other words, as illustrated in FIG. 1, the conductive layer 12 is allowed to shield, from light, a plug section of the second photoelectric conversion section PD2, the contact section 3, the overflow barrier 4, the charge accumulation section 5, the contact section 6, and the plug region 7. As a material of the conductive layer 12, a conductive material with a favorable light-shielding property is used. Further, the conductive layer 12 is electrically connected to the semiconductor base 1. As the material of the conductive layer 12, for example, a configuration of a barrier metal configured of a laminate film of Ti and TiN, and W (tungsten) may be used. It is to be noted that the configuration and the materials are not limited thereto, and any other material may be used for the conductive layer 12.

An insulating layer 13 is so formed as to cover the conductive layer 12. The insulating layer 13 may be formed without using a material of a low interface state unlike the insulating layer 11 therebelow, but with use of a typical insulating material. In the insulating layer 13, contact holes are formed above the respective conductive layers 12 connected to the respective contact sections 3 and 6, and conductive plug layers 14 are so formed as to be embedded in the contact holes.

A lower electrode 21 of the organic photoelectric conversion section and a wiring layer 15 are so formed on the insulating layer 13 as to be connected to the respective conductive plug layers 14. The lower electrode 21 is connected to the conductive plug layer 14 on the conductive layer 12 connected to the N+ contact section 3. The wiring layer 15 is connected to the conductive plug layer 14 on the conductive layer 12 connected to the P+ contact section 6. For the lower electrode 21, a transparent conductive material is used to allow light to enter the photoelectric conversion sections PD1 and PD2 in the semiconductor base 1. For the wiring layer 15, the same material as that of the lower electrode 21 or a material different from that of the lower electrode 21 may be used. In a case where the same material as that of the lower electrode 21 is used for the wiring layer 15, the wiring layer 15 and the lower electrode 21 are allowed to be concurrently formed by performing patterning on one layer. An insulating layer 16 for planarization is formed in a portion other than the lower electrode 21 and the wiring layer on the insulating layer 13.

An organic photoelectric conversion layer 22 made of an organic photoelectric conversion material is so formed on the lower electrode 21 as to be connected to the lower electrode 21. The organic photoelectric conversion layer 22 is so formed as to extend leftward from the lower electrode 21. Further, an upper electrode 23 is so formed on the organic photoelectric conversion layer 22 as to be connected to the organic photoelectric conversion layer 22. The upper electrode 23 is so formed as to extend rightward (outward) from the organic photoelectric conversion layer 22. Although not illustrated, the upper electrode 23 is so formed as to extend leftward from the organic photoelectric conversion layer 22 in a similar manner. For the upper electrode 23, a transparent conductive material is used to allow light to enter the organic photoelectric conversion layer 22.

Then, the organic photoelectric conversion section is configured of the lower electrode 21, the organic photoelectric conversion layer 22, and the upper electrode 23, and in the organic photoelectric conversion section, light of green G is detected. The organic photoelectric conversion layer 22 absorbs light of green G to perform photoelectric conversion, and has a function as a color filter that allows light of blue B and red R to pass therethrough. Then, since the organic photoelectric conversion section configured by including the organic photoelectric conversion layer 22 and the photoelectric conversion sections PD1 and PD2 formed in the semiconductor base 11 are vertically laminated, one pixel is allowed to receive and detect light of three colors R, G and B.

As the transparent conductive material of the lower electrode 21 and the upper electrode 23, for example, indium tin oxide (ITO), $SnO_2$ added with a dopant, and aluminum zinc oxide (for example, AZO) obtained by adding Al as a dopant to ZnO may be used. Moreover, gallium zinc oxide (for example, GZO) obtained by adding Ga as a dopant to ZnO, indium zinc oxide (for example, IZO) obtained by adding In as a dopant to ZnO may be used. Further, CuI, $InSbO_4$, ZnMgO, $CuInO_2$, $MgIn_2O_4$, CdO, $ZnSnO_3$, and the like may be used.

As the organic photoelectric conversion material that performs photoelectric conversion on light of green G of the organic photoelectric conversion layer 22, for example, an organic photoelectric conversion material including a rhodamine-based pigment, a meracyanine pigment, quinacridone, or the like may be used.

Moreover, although not illustrated, for example, as disclosed in Japanese Unexamined Patent Application Publication No. 2007-81137, a case where the organic photoelectric conversion layer 22 has a configuration in which a leveling film, an electron blocking film, a photoelectric conversion film, a hole blocking film, a hole blocking and buffering film, and a work function adjusting film are laminated on a lower electrode is included.

Further, the organic photoelectric conversion layer 22 may preferably include one or both of an organic p-type semiconductor and an organic n-type semiconductor. As each of the organic p-type semiconductor and the organic n-type semiconductor, specifically any of a quinacridone derivative, a naphthalene derivative, an anthracene derivative, a phenanthrene derivative, a tetracene derivative, a pyrene derivative, a perylene derivative, and a fluoranthene derivative may be preferably used. Moreover, polymers such as phenylene vinylene, fluorene, carbazole, indole, pyrene, pyrrole, picoline, thiophene, acetylene, and diacetylene, and derivatives thereof may be used. Further, a metal complex pigment, a cyanine-based pigment, a merocyanine-based pigment, a phenylxanthene-based pigment, a triphenylmethane-based pigment, a rhodacyanine-based pigment, a xanthene-based pigment, a macrocyclic azaannulene-based pigment, an azulene-based pigment, naphthoquinone, an anthraquinone-based pigment, anthracene, a chain compound obtained by condensing a condensed polycyclic aromatic group such as pyrene and an aromatic ring or a heterocyclic compound, or quinoline having a squarylium group and a croconic methine group as bonding chains, two nitrogen-containing heterocycles such as benzothiazole, and benzoxazole, or a cyanine-like pigment linked through a squarylium group and a croconic methine group, or the like may be preferably used. Furthermore, as the above-described metal complex pigment, a dithiol metal complex-based pigment, a metallic phthalocyanine pigment, a metallic porphyrin pigment, or a ruthenium complex pigment may be preferable, and the ruthenium complex pigment may be specifically preferable; however, the material is not limited to those described above.

On the upper electrode 23 of the organic photoelectric conversion section, a passivation layer 24 for protection of the organic photoelectric conversion layer 22 is so formed as to cover a top of the organic photoelectric conversion layer 22. In this embodiment, specifically, an ALD insulating film 25 is so formed by an ALD (Atomic Layer Deposition) method as to be embedded in a slit, that is formed by a level difference on a surface of the upper electrode 23, of the passivation layer 24 and as to be located on the passivation layer 24.

The ALD insulating film 25 has a function of compensating for a passivation property of the passivation layer 24. Moreover, the ALD insulating film 25 has a configuration in which a refractive index thereof is smaller than that of the passivation layer 24. Therefore, incident light is allowed to be reflected by the ALD insulating film 25 formed in the slit of the passivation layer 24 and extending in an oblique direction in the diagram, thereby being condensed to the passivation layer 24 located inside; therefore, a light-condensing property is allowed to be improved.

As a material of the ALD insulating film 25, for example, $Al_2O_3$, SiON or the like may be used. It is to be noted that, as long as the ALD insulating film 25 is a film with a smaller refractive index than that of the passivation layer 24, the material of the ALD insulating film 25 is not limited thereto.

Moreover, a contact hole is formed in the passivation layer 24 and the ALD insulating film 25 on a portion extending rightward (outward) from the organic photoelectric conversion layer 22 of the upper electrode 23. Then, a wiring layer 26 is so formed as to be embedded in the contact hole and as to extend rightward. The wiring layer 26 is so formed on the wiring layer 15 as to be connected to the wiring layer 15.

Therefore, the upper electrode 23 of the organic photoelectric conversion section and a circuit device on the bottom surface side of the semiconductor base 1 are electrically connected to each other through respective portions of the wiring layer 26, the wiring layer 15, the contact section 6, and the conductive plug region 7. Examples of a material of the wiring layer 26 may include W, Ti, TiN, Al, and the like, but the material of the wiring layer 26 is not limited thereto.

Since a contact hole for the wiring layer 26 is not formed on the organic photoelectric conversion layer 22, a passivation property with respect to the organic photoelectric conversion layer 22 by the passivation layer 24 and the ALD insulating film 25 is not reduced by the contact hole.

The solid-state image pickup device according to this embodiment is allowed to be manufactured, for example, as will be described below.

Figure 2A:
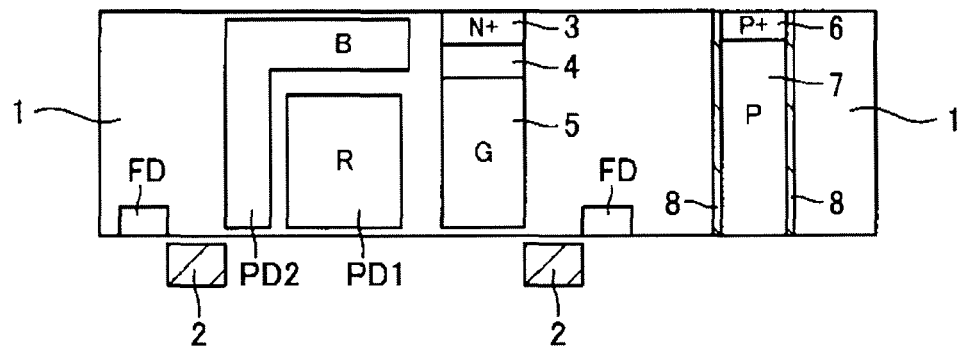
FIG. 2A is a manufacturing process diagram illustrating a method of manufacturing the solid-state image pickup device in FIG. 1.

First, as illustrated in FIG. 2A, a semiconductor region and an insulating film in the semiconductor base 1 are formed. In other words, two photoelectric conversion sections PD1 and PD2, the floating diffusions FD, the contact section 3, the overflow barrier 4, the charge accumulating layer 5, the contact section 6, the plug layer 7, and the insulating film 8 are formed. Then, the transfer gates 2 and circuit devices, that are not illustrated, such as a pixel transistor and a logic circuit of a peripheral circuit section are formed with respect to the semiconductor base 1. Moreover, although not illustrated, a wiring section (a multilayer wiring layer) in which a plurality of layers of wiring are arranged with an interlayer insulating film in between is formed. After that, the supporting substrate is bonded to the wiring section (the multilayer wiring layer). It is to be noted that, in a case where a silicon layer of an SOI substrate is used for the semiconductor base 1, after the supporting substrate is bonded, the silicon substrate and SiO2 film of the SOI substrate are removed.

Figure 2B:
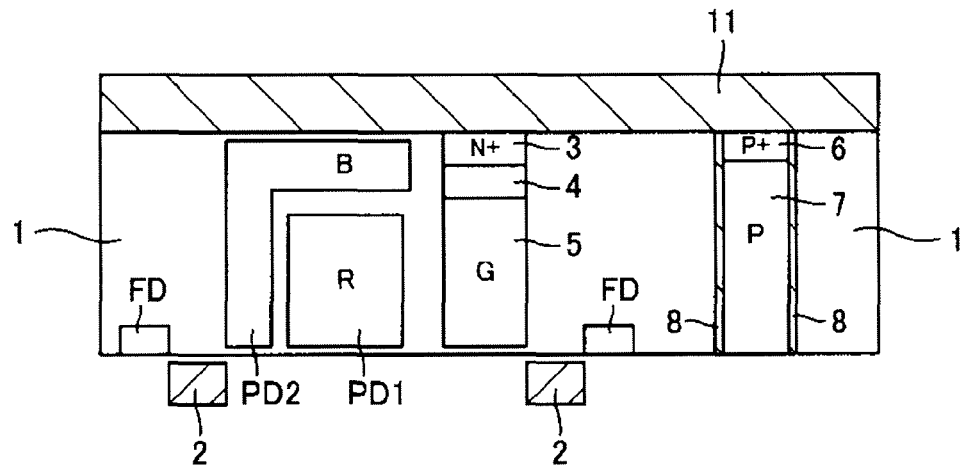
FIG. 2B is a manufacturing process diagram illustrating a step following FIG. 2A.

Next, as illustrated in FIG. 2B, the insulating layer 11 is formed on the semiconductor base 1. As the insulating layer 11, as described above, to suppress generation of a dark current from an interface between the semiconductor base 1 and the insulating layer 11, a material with a small interface state may be preferably used. For example, the insulating layer 11 is formed of a laminate film of a hafnium oxide film formed by the ALD method and a $SiO_2$ film formed by the plasma CVD method.

Figure 2C:
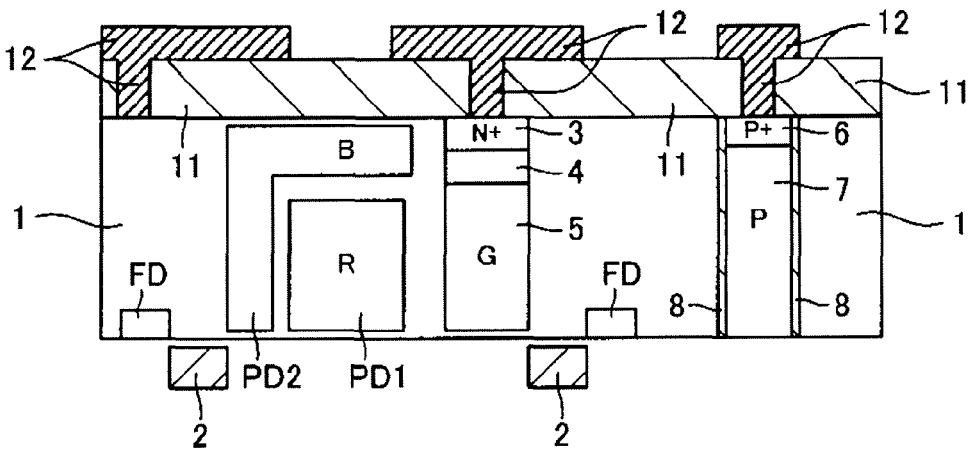
FIG. 2C is a manufacturing process diagram illustrating a step following FIG. 2B.

Next, after the contact hole is formed in the insulating layer 11, a conductive layer is so formed on the insulating layer 11 as to be embedded in the contact hole. Moreover, the conductive layer is so processed as to leave a portion that is to be shielded from light, and as illustrated in FIG. 2C, the conductive layer 12 configured of a conductive plug and the wiring layer is formed. For the conductive layer 12, for example, the above-described configuration of a barrier metal configured of a laminate film of Ti and TiN, and W (tungsten) may be used.

Figure 2D:
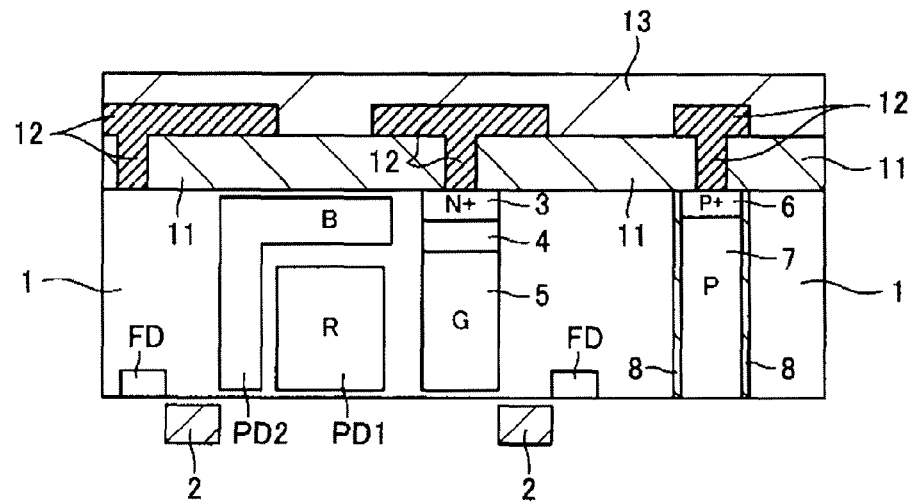
FIG. 2D is a manufacturing process diagram illustrating a step following FIG. 2C.

Next, as illustrated in FIG. 2D, after the insulating layer 13 such as a $SiO_2$ film is so formed on the insulating layer 11 by, for example, a plasma CVD method as to cover a top of the conductive layer 12, a surface of the insulating layer 13 is planarized by, for example, a CMP (chemical mechanical polishing) method.

Figure 2E:
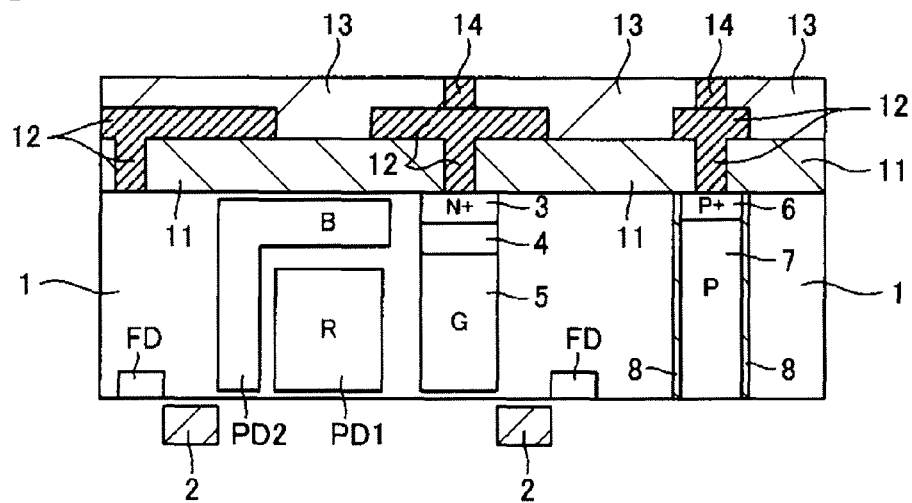
FIG. 2E is a manufacturing process diagram illustrating a step following FIG. 2D.

Then, a contact hole reaching the conductive layer 12 is formed in the insulating layer 13. Next, as illustrated in FIG. 2E, the conductive plug layer 14 is so formed as to be embedded in the contact hole. The conductive plug layer 14 is formed, for example, by forming a laminate film of TiN and W, and then removing surpluses of W and TiN on the insulating film 13 by the CMP method.

Figure 2F:
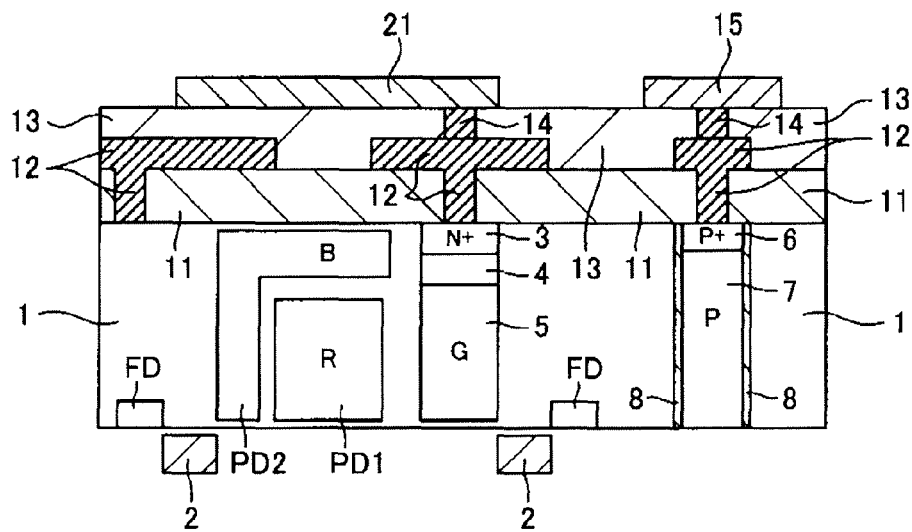
FIG. 2F is a manufacturing process diagram illustrating a step following FIG. 2E.

Next, as illustrated in FIG. 2F, the lower electrode 21 of the organic photoelectric conversion section and the wiring layer 15 are formed on the insulating layer 13 and the conductive plug layer 14. After a film of ITO is formed by, for example, a sputtering method, patterning is performed by photolithography technology, and the lower electrode 21 is processed with use of dry etching or wet etching. It is to be noted that the material of the lower electrode 21 is not limited to ITO, and the above-described various transparent conductive materials may be used.

In a case where the material of the wiring layer 15 is the same as that of the lower electrode 21, the wiring layer 15 and the lower electrode 21 are allowed to be concurrently formed by patterning. In a case where the material of the wiring layer 15 is a conductive material different from that of the lower electrode 21, the wiring layer 15 is formed before or after the lower electrode 21 is formed.

Figure 2G:
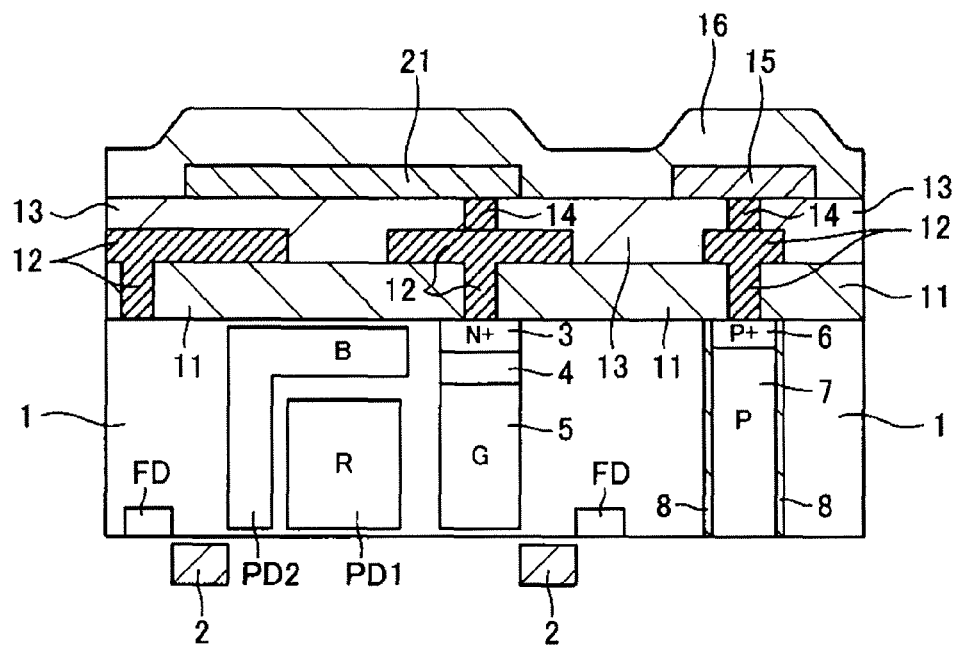
FIG. 2G is a manufacturing process diagram illustrating a step following FIG. 2F.
Figure 2H:
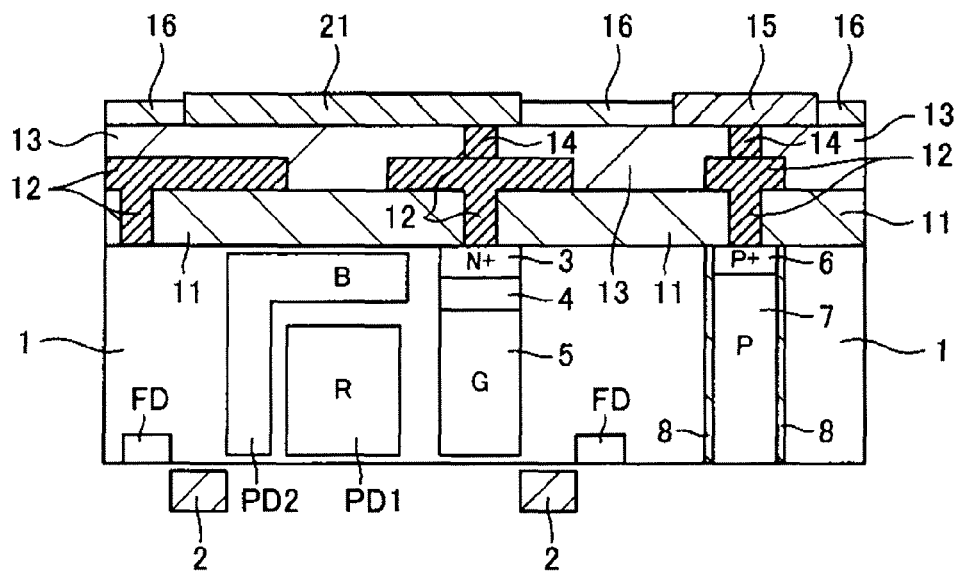
FIG. 2H is a manufacturing process diagram illustrating a step following FIG. 2G.

Next, as illustrated in FIG. 2G, the insulating layer 16 is formed by forming a $SiO_2$ film on the lower electrode 18 by, for example, a plasma CVD method. Then, as illustrated in FIG. 2H, the lower electrode 18 and the wiring layer 15 are exposed on the insulating layer 16 by performing planarization processing with use of, for example, a CMP method. At this time, the insulating layer 16 is so recessed as to be thinner than the lower electrode 21.

Figure 2I:
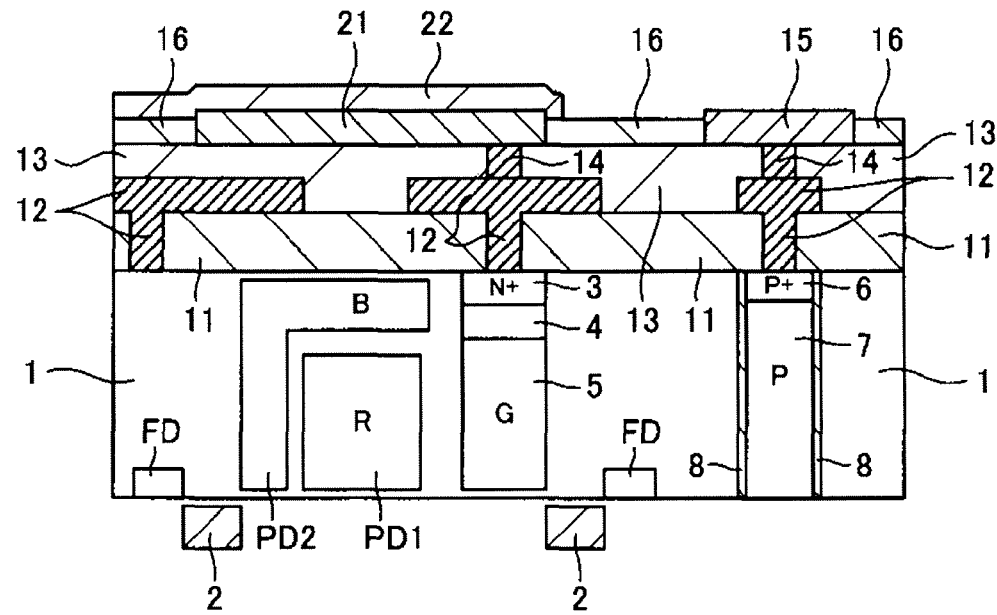
FIG. 2I is a manufacturing process diagram illustrating a step following FIG. 2H.

Next, as illustrated in FIG. 2I, the organic photoelectric conversion layer 22 is formed in a desired pattern with use of a metal mask. For example, in a case where the quinacridone derivative is used for the organic photoelectric conversion layer 22, the organic photoelectric conversion layer 22 is allowed to be formed by vacuum deposition. The organic photoelectric conversion layer 22 is so located inside the pattern of the upper electrode 23 that is to be processed later as not to be exposed during processing of the upper electrode 23. Moreover, the organic photoelectric conversion layer 22 is not necessarily formed with use of the metal mask, and the organic photoelectric conversion layer 22 may be formed in a desired pattern with use of printing technology or the like.

Figure 2J:
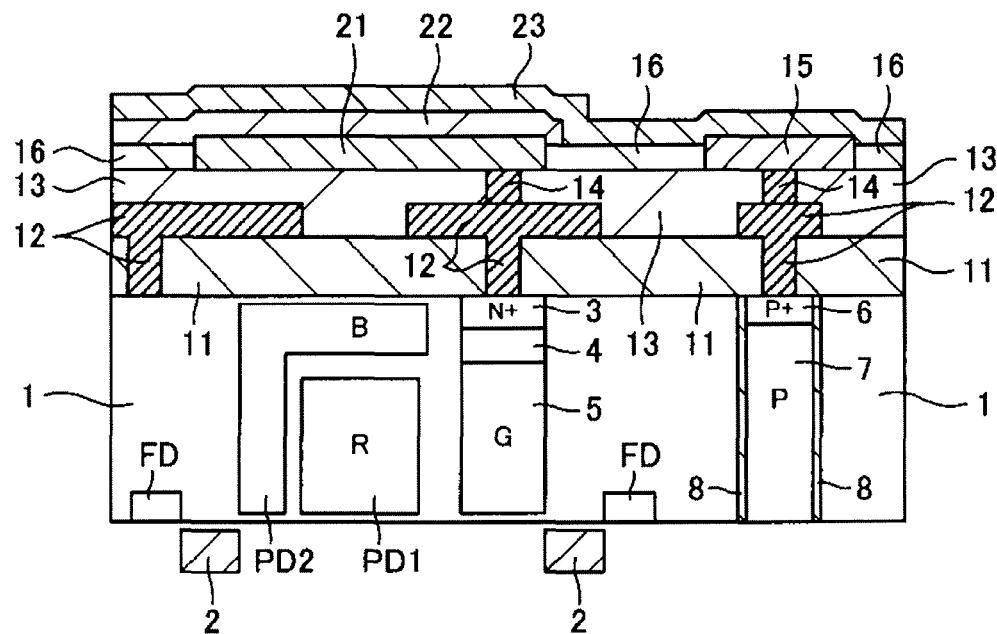
FIG. 2J is a manufacturing process diagram illustrating a step following FIG. 2I.

Then, as illustrated in FIG. 2J, the upper electrode 23 is formed on the entire organic photoelectric conversion layer 22. For the upper electrode 23, the above-described various materials such as ITO may be used. It is known that characteristics of the organic photoelectric conversion layer 22 greatly vary by influences of water, oxygen, hydrogen, and the like. Therefore, is it desirable to form the upper electrode 23 with the organic photoelectric conversion layer 22 by in-situ vacuum processing.

Figure 2K:
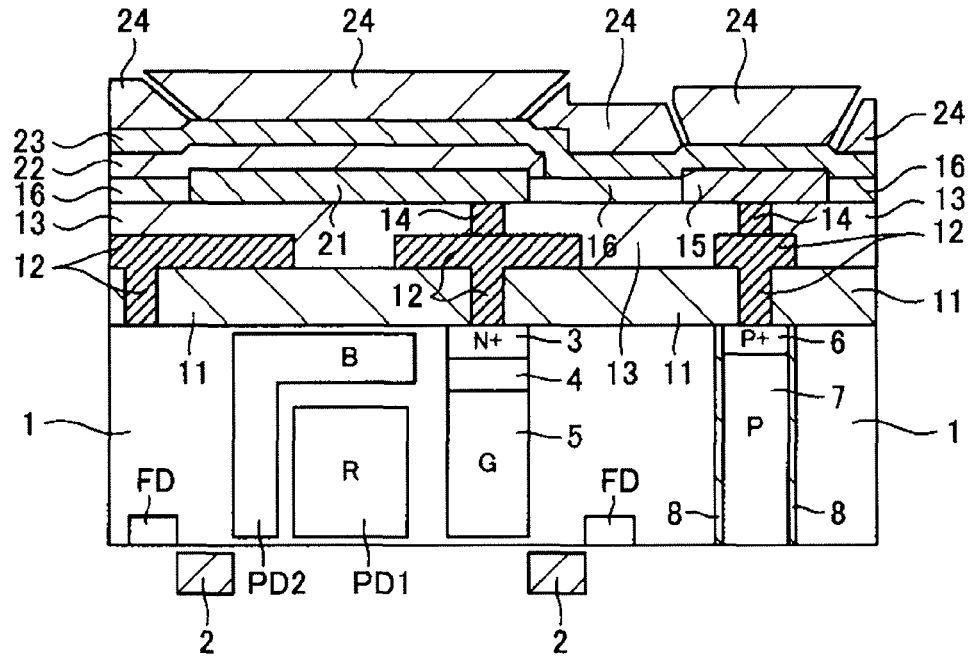
FIG. 2K is a manufacturing process diagram illustrating a step following FIG. 2J.

After that, the passivation layer 24 is formed with use of a material such as SiN, $SiO_2$, or SiON by, for example, a CVD method. At this time, as illustrated in FIG. 2K, a slit is formed in the passivation layer 24 due to a level difference below the passivation layer 24.

Figure 2L:
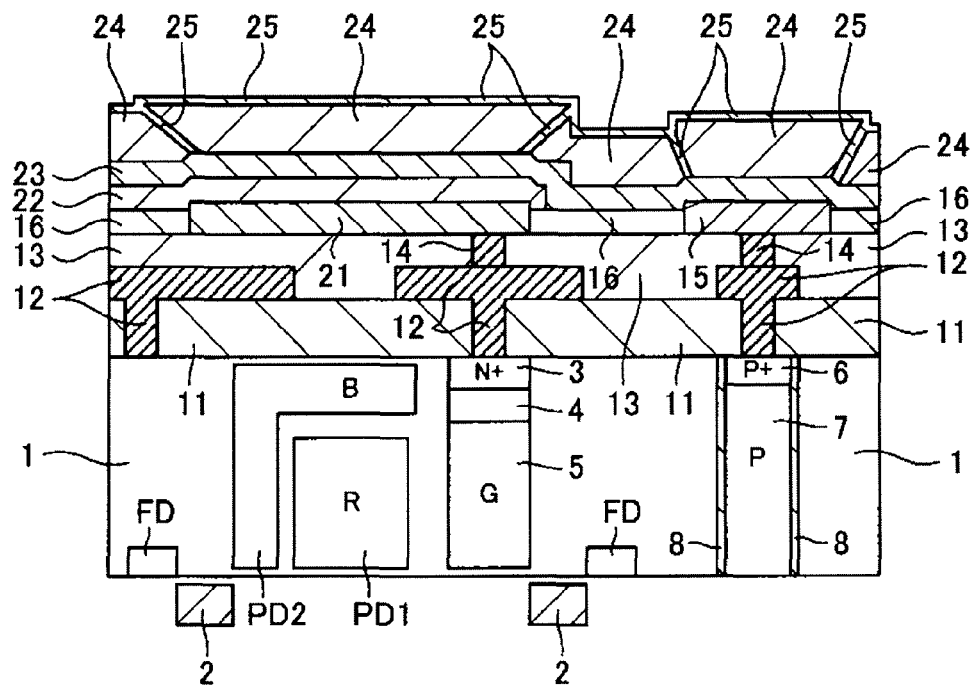
FIG. 2L is a manufacturing process diagram illustrating a step following FIG. 2K.

After that, as illustrated in FIG. 2L, the ALD insulating film 25 with high passivation performance is formed by the ALD (Atomic Layer Deposition) method. A material with a smaller refractive index than that of the passivation layer 24 is used for the ALD insulating film 25. At this time, since the ALD method is a film formation technique with high step coverage, as illustrated in FIG. 2L, the slit in a level difference portion of the passivation layer 24 is allowed to be filled with the ALD insulating film 25. In this case, as the material of the ALD insulating film 25, the above-described $Al_2O_3$, SiON, and the like may be used.

Figure 2M:
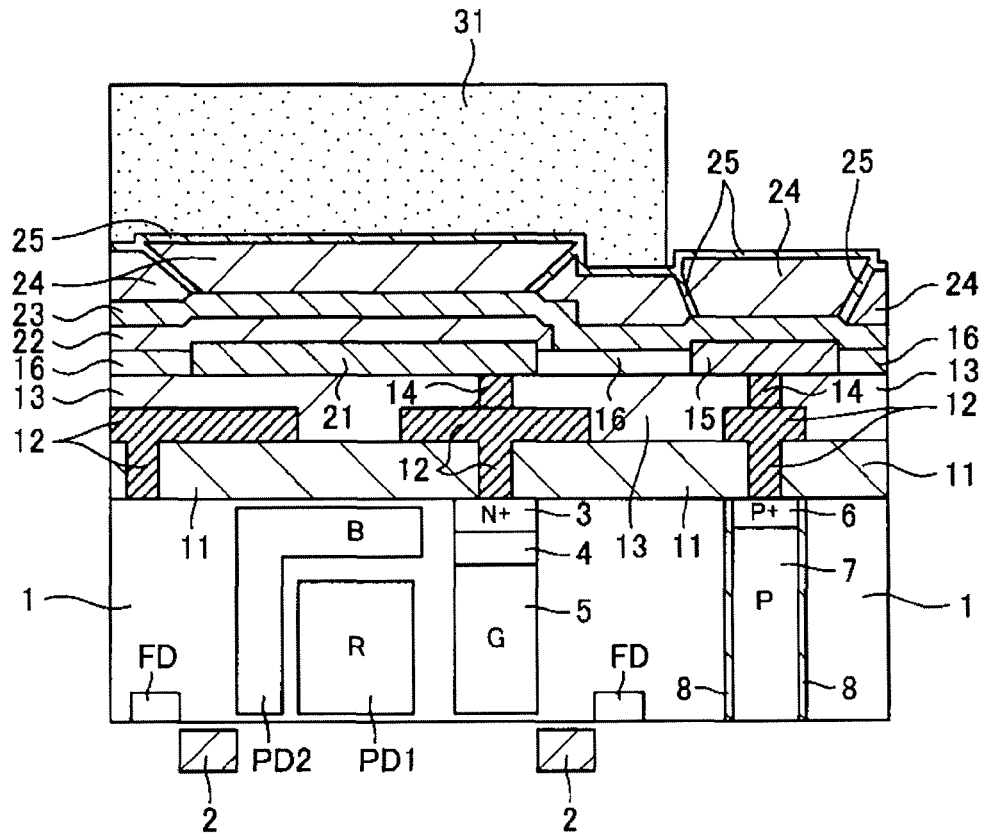
FIG. 2M is a manufacturing process diagram illustrating a step following FIG. 2L.
Figure 2N:
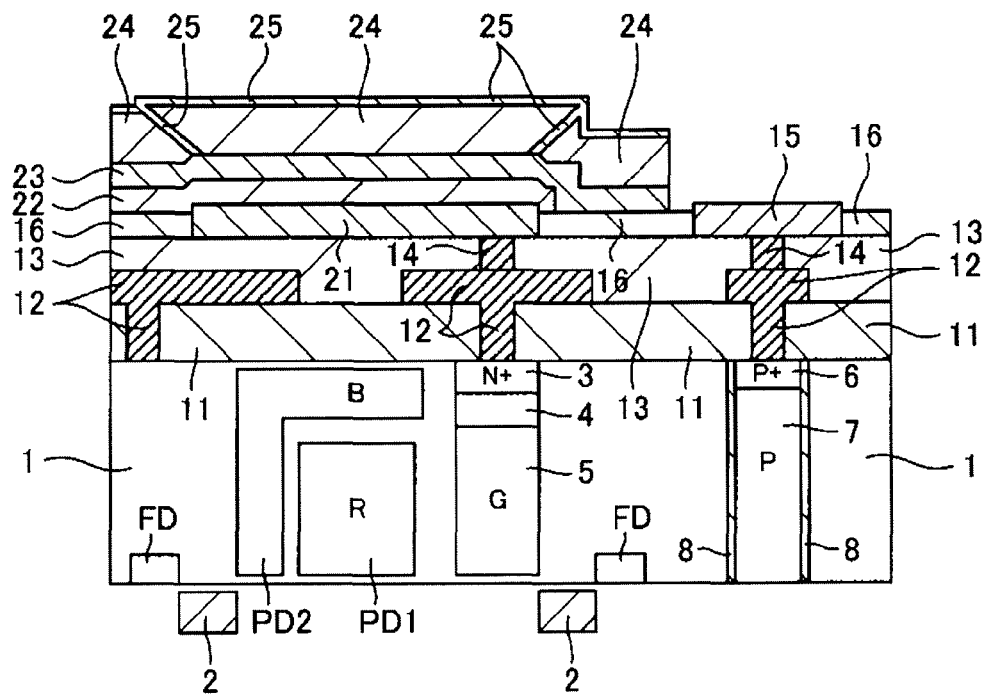
FIG. 2N is a manufacturing process diagram illustrating a step following FIG. 2M.

Next, as illustrated in FIG. 2M, a resist 31 for patterning of the ALD insulating film 25 and the passivation layer 24 is formed on the ALD insulating film 25. Next, as illustrated in FIG. 2N, with use of the resist 31 as a mask, the ALD insulating film 25, the passivation layer 24, and the upper electrode 23 are patterned by sequentially processing these layers 25, 24, and 23 by dry etching. Next, post-processing such as ashing and organic cleaning is performed to remove a deposit and a residue. In these steps of patterning and post-processing, the organic photoelectric conversion layer 22 is not exposed; therefore, the organic photoelectric conversion layer 22 is less susceptible to damage. Moreover, the upper electrode 23 is covered with the passivation layer 24 and the ALD insulating film 25; therefore an issue that the organic photoelectric conversion layer 22 below the upper electrode 23 disappears by entry of a chemical solution for post-processing through a pin hole included in ITO or the like of the upper electrode 23 is allowed to be curbed.

Figure 2O:
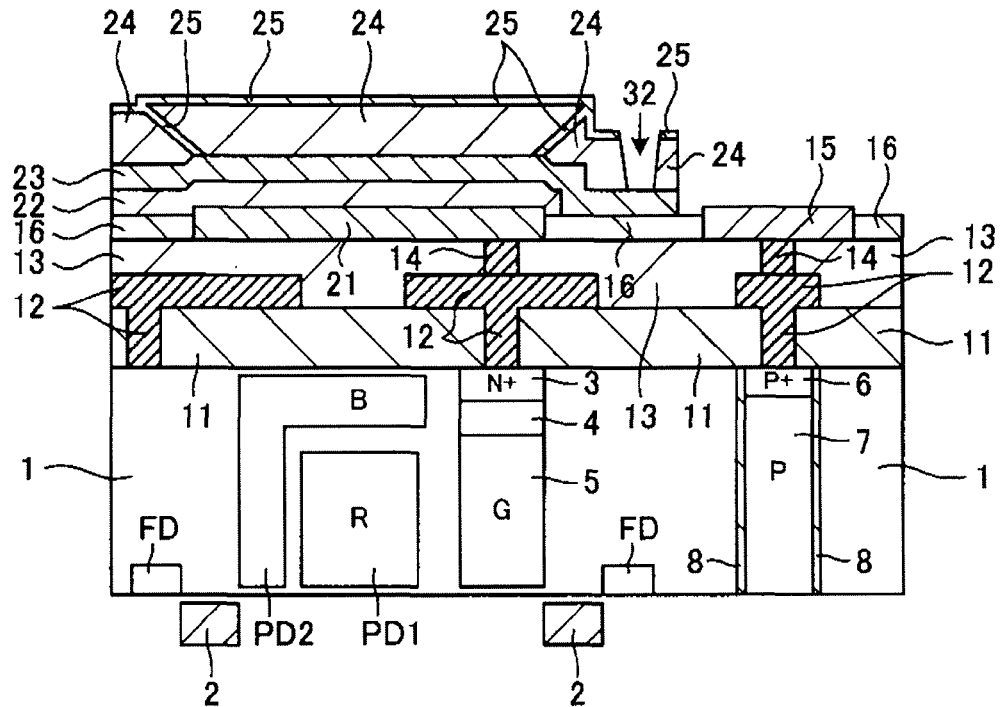
FIG. 2O is a manufacturing process diagram illustrating a step following FIG. 2N.

After that, as illustrated in FIG. 2O, a contact opening section 32 for connection to the upper electrode 23 is formed in the passivation layer 24 and the ALD insulating film 25 on a portion extending rightward from the organic photoelectric conversion layer 22 of the upper electrode 23. At this time, when the organic photoelectric conversion layer 22 is located below the contact opening section 32, a chemical solution enters through the pin hole of the upper electrode 23 by cleaning after processing, thereby causing an issue that the organic photoelectric conversion layer 22 below the upper electrode 23 disappears. In this embodiment, as illustrated in FIG. 2O, the organic photoelectric conversion layer 22 is not formed below the contact opening section 32; therefore, the issue that the organic photoelectric conversion layer 22 disappears is allowed to be avoided.

Figure 3:
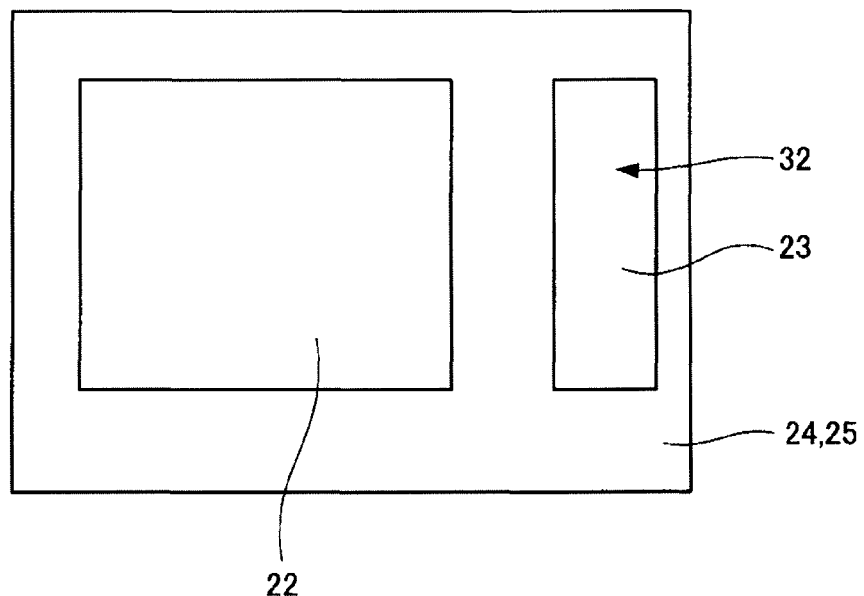
FIG. 3 is a diagram illustrating a planar layout of a state in FIG. 2O.

FIG. 3 illustrates a planar layout of a state in FIG. 2O. As illustrated in FIG. 3, the contact opening section 32 where an opening is formed in the passivation layer 24 and the ALD insulating film 25 and the lower electrode 23 is exposed is formed separately from the organic photoelectric conversion layer 22.

Figure 2P:
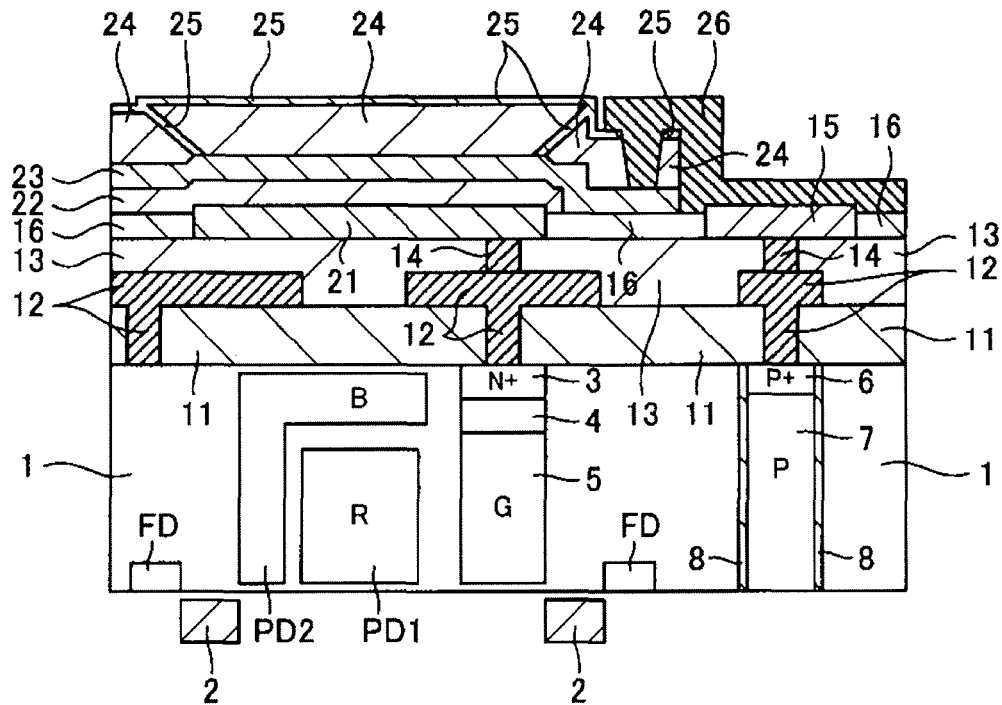
FIG. 2P is a manufacturing process diagram illustrating a step following FIG. 2O.

After that, a metal layer is so formed on a surface as to be embedded in the contact opening section 32, and this metal layer is patterned to form the wiring layer 26 that is connected to each of the upper electrode 23 and the wiring layer 15 as illustrated in FIG. 2P. After that, although not illustrated, a passivation layer configured to protect the wiring layer 26 or the like, a planarization film, an on-chip lens, and the like are sequentially formed. Thus, the solid-state image pickup device according to this embodiment illustrated in FIG. 1 is allowed to be manufactured.

In the configuration of the solid-state image pickup device according to the above-described embodiment, the ALD insulating film 25 with a smaller refractive index than that of the passivation layer 24 is formed on the passivation layer 24 with which the organic photoelectric conversion layer 22 is covered and in the slit formed on the level difference in the passivation layer 24. Therefore, entry of water or the like from outside to the organic photoelectric conversion layer 22 through the slit is allowed to be reduced; therefore, the passivation property with respect to the organic photoelectric conversion layer 22 is allowed to be improved. Accordingly, reliability of the solid-state image pickup device is allowed to be improved.

Moreover, the ALD insulating film 25 with a smaller refractive index than that of the passivation layer 24 is formed in the slit obliquely formed. Therefore, incident light is allowed to be reflected by an interface between the ALD insulating film 25 in the slit and the passivation layer 25, thereby being condensed to a central portion of the passivation layer 24; therefore, the light-condensing characteristics are allowed to be improved to achieve favorable light-condensing characteristics.

Therefore, both an improvement in the passivation property with respect to the organic photoelectric conversion layer 22 and favorable light-condensing characteristics are allowed to be achieved by this embodiment.

Moreover, in this embodiment, specifically, the slit formed in the passivation layer 24 is filled with the ALD insulating film 25 formed by the ALD method. The ALD method is a film formation method with high step coverage; therefore, a thin and narrow space such as a slit is allowed to be filled with a film; therefore, the slit is allowed to be easily filled with the ALD insulating film 25.

In the above-described embodiment, as a combination of colors, the organic photoelectric conversion section is set to green G, the first photoelectric conversion section PD1 is set to red R, and the second photoelectric conversion section PD2 is set to blue B; however, in the present technology, any other combination of colors is possible. For example, the organic photoelectric conversion section is allowed to be set to red R or blue B, and two photoelectric conversion sections in the semiconductor base are allowed to be set to any other opposite color. As an organic photoelectric conversion material that performs photoelectric conversion on light of red R, an organic photoelectric conversion material including a phthalocyanine-based pigment may be used. As an organic photoelectric conversion material that performs photoelectric conversion on light of blue B, an organic photoelectric conversion material including a coumarin-based pigment, a meracyanine-based pigment, or the like may be used.

Moreover, in the present technology, the number of organic photoelectric conversion sections may be two layers, and the number of photoelectric conversion sections inside the semiconductor base may be one layer. It is to be noted that three organic photoelectric conversion sections may be laminated on the semiconductor base without providing the photoelectric conversion section in the semiconductor base; however, a necessary volume is allowed to be reduced by providing one or more photoelectric conversion sections in the semiconductor base.

In the above-described embodiment, a case where the passivation layer 24 has a single-layer configuration is described; however, the passivation layer 24 may have a laminate configuration of two or more layers.

In the above-described embodiment, different surfaces of the semiconductor base serve as the light incident surface and the circuit formation surface to form a so-called backside illumination type configuration. The present technology is applicable to a front-illuminated configuration in which a same surface of the semiconductor base serves as both the light incident surface and the circuit formation surface.

A configuration of the passivation layer and ALD insulating film in the present technology is applicable to not only the solid-state image pickup device but also a case where a level difference is formed by an organic layer needing passivation in a typical semiconductor device or any other device.

2. Modification Example of First Embodiment

Figure 4:
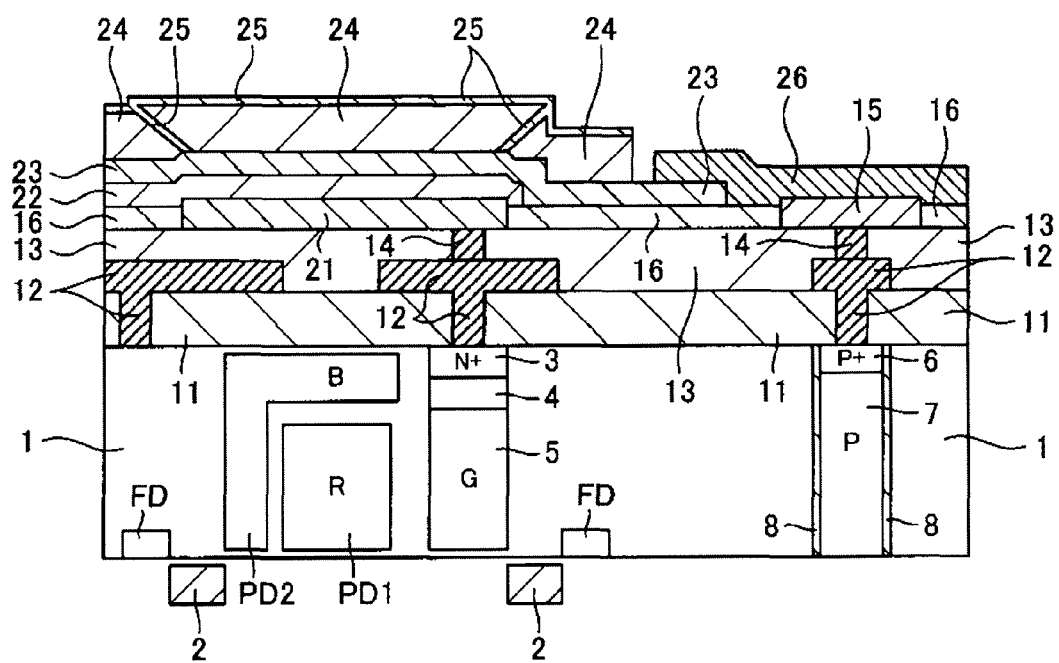
FIG. 4 is a schematic configuration diagram (a sectional view of a main part) of a solid-state image pickup device according to a modification example of the first embodiment.

Next, a modification example of the first embodiment will be described below. FIG. 4 illustrates a schematic configuration diagram (a sectional view of a main part) of a solid-state image pickup device according to the modification example of the first embodiment. In this modification example, as illustrated in FIG. 4, the upper electrode 23 of the organic photoelectric conversion section is so formed as to extend rightward from the passivation layer 24 and the ALD insulating film 25. Then, the wiring layer 26 is connected to this extended portion of the upper electrode 23. Therefore, since the extended portion of the upper electrode 23 is not covered with the passivation layer 24 and the ALD insulating film 25, the upper electrode 23 and the wiring layer 26 are allowed to be connected to each other without forming the contact opening section in the passivation layer 24 and the ALD insulating film 25.

Since the passivation layer 24 is thicker than the upper electrode 23, in a case of the configuration in FIG. 1, it is necessary to form the wiring layer 26 on a large level difference by the passivation layer 24. Therefore, it is desirable to select the material and formation method of the wiring layer 26 so as not to cut the wiring layer 26 by the level difference and so as to allow the contact opening section to be filled with the wiring layer 26. On the other hand, in the configuration in this modification example, since the wiring layer 26 is formed on a small level difference by the upper electrode 23, the wiring layer 26 is easily formed, and restrictions in the material and formation conditions of the wiring layer 26 are reduced. It is to be noted that, compared to the configuration in FIG. 1, a connection section with the wiring layer 26 is moved rightward, thereby increasing a pixel size. Moreover, in the configuration in this modification example, the contact opening section is not formed in the passivation layer 24 and the ALD insulating film 25; therefore, compared to the configuration in FIG. 1, the passivation property with respect to the organic photoelectric conversion layer 22 is allowed to be improved.

In a case where the configuration in this modification example is manufactured, with use of the resist 31 illustrated in FIG. 2M as a mask, the ALD insulating film 25 and the passivation layer 24 are sequentially processed by dry etching. After that, the resist 31 is removed, and a resist for patterning of the upper electrode 23 is formed, and the upper electrode 23 is processed by dry etching.

The solid-state image pickup device according to the present technology is applicable to various kinds of electronic apparatuses including, for example, camera systems such as digital still cameras and digital video cameras, cellular phones having an image pickup function, and any other apparatuses having an image pickup function.

3. Second Embodiment

Electronic Apparatus

Figure 5:
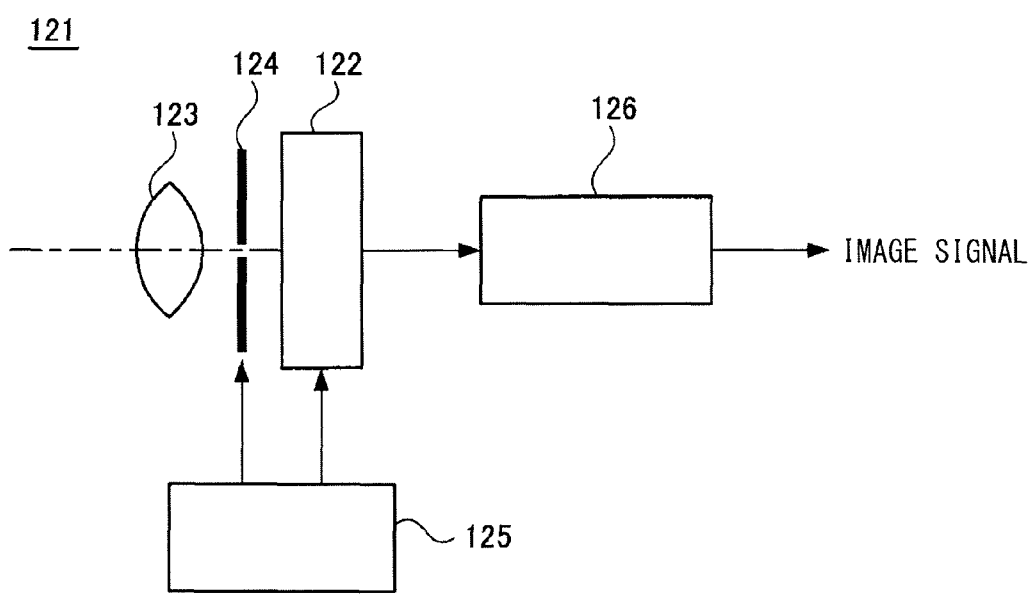
FIG. 5 is a schematic configuration diagram (a block diagram) of an electronic apparatus according to a second embodiment.

FIG. 5 illustrates a schematic configuration diagram (a block diagram) of an electronic apparatus according to a second embodiment. This embodiment is a case where the present technology is applied to an electronic apparatus having a camera capable of shooting a still image or moving image.

As illustrated in FIG. 5, an electronic apparatus 121 includes a solid-state image pickup device 122, an optical system 123, a shutter unit 124, a drive circuit 125, and a signal processing circuit 126.

The optical system 123 is configured of an optical lens and the like, and forms an image of image light (incident light) from a subject on a pixel section of the solid-state image pickup device 122. Therefore, a signal charge is stored in the solid-state image pickup device 122 for a certain period. The optical system 123 may be configured of an optical lens group including a plurality of optical lenses. As the solid-state image pickup device 122, the solid-state image pickup device according to the present technology such as the solid-state image pickup devices in the above-described embodiment and the modification example thereof is used. The shutter unit 124 controls a light application period and a light-shielding period for the solid-state image pickup device 122. The drive circuit 125 supplies a drive signal for control of a transfer operation of the solid-state image pickup device 122 and a shutter operation of the shutter unit 124. Signal transfer of the solid-state image pickup device 122 is performed by a drive signal (a timing signal) supplied from the drive circuit 125. The signal processing circuit 126 performs various kinds of signal processing. An image signal subjected to signal processing is stored in a storage medium such as a memory, or is output to a monitor.

In the configuration of the electronic apparatus 121 according to the above-described embodiment, as the solid-state image pickup device 122, the solid-state image pickup device according to the present technology such as the solid-state image pickup devices in the above-described embodiment and the modification example thereof is used. Therefore, in the solid-state image pickup device 122, reliability of solid-state image pickup device 122 and the electronic apparatus 121 is allowed to be improved by improving the passivation property with respect to the organic photoelectric conversion layer, and the light condensing characteristics are allowed to be improved.

In the present technology, the configuration of the electronic apparatus is not limited to the configuration illustrated in FIG. 5, and as long as the electronic apparatus has a configuration using the solid-state image pickup device according to the present technology, any configuration other than that illustrated in FIG. 5 is allowed to be adopted.

It is to be noted that the present disclosure is allowed to have following configurations.

(1) A solid-state image pickup device including:
an organic photoelectric conversion layer;
a passivation layer formed to cover a top of the organic photoelectric conversion layer; and
an insulating film formed on the passivation layer and in a slit produced on a level difference in the passivation layer, the insulating film having a smaller refractive index than that of the passivation layer.

(2) The solid-state image pickup device according to (1), in which an organic photoelectric conversion section configured by including the organic photoelectric conversion layer and a photoelectric conversion section formed in a semiconductor base are vertically laminated.

(3) The solid-state image pickup device according to (1) or (2), in which the insulating film is a film formed by an atomic layer deposition method (ALD method).

(4) The solid-state image pickup device according to any one of (1) to (3), in which an upper electrode connected to the organic photoelectric conversion layer is formed to extend outward from the organic photoelectric conversion layer, and a contact opening section and a wiring layer are further included, the contact opening section being formed in the passivation layer and the insulating film on a portion formed to extend of the upper electrode, the wiring layer being formed inclusive of the inside of the contact opening section and being connected to the upper electrode.

(5) A method of manufacturing a solid-state image pickup device including an organic photoelectric conversion layer, the method including steps of:
forming the organic photoelectric conversion layer;
forming a passivation layer to cover a top of the organic photoelectric conversion layer; and
forming an insulating film on the passivation layer and in a slit produced on a level difference in the passivation layer, the insulating film having a smaller refractive index than that of the passivation layer.

(6) The method of manufacturing the solid-state image pickup device according to (5) in which the insulating film is formed with use of an atomic layer deposition method (ALD method).

(7) An electronic apparatus including:

an optical system;

the solid-state image pickup device according to any one of (1) to (4); and a signal processing circuit configured to process an output signal of the solid-state image pickup device.

The present technology is not limited to the above-described embodiments, and may have any other various configurations without departing from the scope of the present technology.

The present disclosure contains subject matter related to that disclosed in Japanese Priority Patent Application No. 2012-104521 filed in the Japan Patent Office on May 1, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state image pickup device comprising:
an organic photoelectric conversion layer;
a passivation layer formed to cover a top of the organic photoelectric conversion layer; and
an insulating film formed on the passivation layer and in a slit produced on a level difference in the passivation layer, the insulating film having a smaller refractive index than that of the passivation layer.

2. The solid-state image pickup device according to claim 1, wherein an organic photoelectric conversion section configured by including the organic photoelectric conversion layer and a photoelectric conversion section formed in a semiconductor base are vertically laminated.

3. The solid-state image pickup device according to claim 1, wherein the insulating film is a film formed by an atomic layer deposition method (ALD method).

4. The solid-state image pickup device according to claim 1, wherein an upper electrode connected to the organic photoelectric conversion layer is formed to extend outward from the organic photoelectric conversion layer, and a contact opening section and a wiring layer are further included, the contact opening section being formed in the passivation layer and the insulating film on a portion formed to extend of the upper electrode, the wiring layer being formed inclusive of the inside of the contact opening section and being connected to the upper electrode.

5. A method of manufacturing a solid-state image pickup device including an organic photoelectric conversion layer, the method comprising steps of:
forming the organic photoelectric conversion layer;
forming a passivation layer to cover a top of the organic photoelectric conversion layer; and
forming an insulating film on the passivation layer and in a slit produced on a level difference in the passivation layer, the insulating film having a smaller refractive index than that of the passivation layer.

6. The method of manufacturing the solid-state image pickup device according to claim 5, wherein the insulating film is formed with use of an atomic layer deposition method (ALD method).

7. An electronic apparatus comprising:
an optical system;
a solid-state image pickup device including an organic photoelectric conversion layer, a passivation layer, and an insulating film, the passivation layer being formed to cover a top of the organic photoelectric conversion layer, and the insulating film being formed on the passivation layer and in a slit produced on a level difference in the passivation layer and having a smaller refractive index than that of the passivation layer; and
a signal processing circuit configured to process an output signal of the solid-state image pickup device.

* * * * *